(12) United States Patent
Liu et al.

(10) Patent No.: US 12,717,388 B2
(45) Date of Patent: Aug. 25, 2026

(54) SWAPPABLE DEVICE AND DATA PROCESSING SYSTEM INCLUDING SUCH SWAPPABLE DEVICE

(71) Applicant: PROMISE TECHNOLOGY, INC., Hsinchu County (TW)

(72) Inventors: Shiang-Jiann Liu, Hsinchu County (TW); Pin-Hsin Kao, Hsinchu County (TW); Chung-Shin Liu, Hsinchu County (TW)

(73) Assignee: PROMISE TECHNOLOGY, INC., Hsinchu County (TW)

( * ) Notice: Subject to any disclaimer, the term of this patent is extended or adjusted under 35 U.S.C. 154(b) by 474 days.

(21) Appl. No.: 18/332,086

(22) Filed: Jun. 9, 2023

(65) Prior Publication Data

US 2023/0400895 A1 Dec. 14, 2023

(30) Foreign Application Priority Data

Jun. 9, 2022 (TW) ................................. 111121480

(51) Int. Cl.

*G06F 1/16* (2006.01)
*G06F 1/185* (2026.01)
*G06F 1/187* (2026.01)
*H05K 7/14* (2006.01)

(52) U.S. Cl.

CPC .............. *G06F 1/187* (2013.01); *G06F 1/185* (2013.01); *H05K 7/1487* (2013.01)

(58) Field of Classification Search

CPC ........ G06F 1/1658; G06F 1/184; G06F 1/187; G06F 1/185; H05K 7/1401; H05K 7/1402; H05K 7/1409; H05K 7/1411; H05K 7/1415; H05K 7/1417; H05K 7/1418; H05K 7/1422; H05K 7/1424; H05K 7/1427; H05K 7/1428; H05K 7/1429; H05K 7/1461; H05K 7/1487; H05K 7/1488; H05K 7/1489; H05K 7/16; G11B 33/022; G11B 33/08; G11B 33/12; G11B 33/128

USPC .................................................... 361/679.33

See application file for complete search history.

(56) References Cited

U.S. PATENT DOCUMENTS 5,657,204 A * 8/1997 Hunt .................... H05K 7/1409 361/752
6,288,911 B1 * 9/2001 Aoki .................... H05K 7/1409 361/801
6,411,517 B1 * 6/2002 Babin .................. H05K 7/1461 361/759

(Continued)

*Primary Examiner* — Gage Crum

(74) *Attorney, Agent, or Firm* — MUNCY, GEISSLER, OLDS & LOWE, P.C.

(57) ABSTRACT

A swappable device includes a first side cover, a lever, a sliding plate, a functional module interface card and a second side cover. When the lever is rotated to move a guide pillar of the lever to a lower end point of an arc-shaped guide groove of the first side cover, a guide pillar of the sliding plate moves toward a rear end point of a linear guide groove of the lever and a lower end point of a linear guide groove of the first side cover. The sliding plate is actuated to drive the functional module interface card to move toward a lower edge of the first side cover relative to the first side cover until a plurality of connectors of the functional module interface card are at the farthest position relative to an upper edge of the first side cover.

7 Claims, 11 Drawing Sheets

(56) References Cited

U.S. PATENT DOCUMENTS

| | | | | |
|---|---|---|---|---|
| 7,215,556 | B2 * | 5/2007 | Wrycraft | H05K 7/1409<br>361/756 |
| 7,364,447 | B1 * | 4/2008 | Desrosiers | G06F 1/186<br>439/372 |
| 7,663,889 | B2 * | 2/2010 | Lajara | G06F 1/185<br>361/759 |
| 7,701,707 | B2 * | 4/2010 | Peng | G11B 33/124<br>248/618 |
| 10,082,844 | B2 * | 9/2018 | Yang | G11B 33/124 |
| 2002/0067592 | A1 * | 6/2002 | Horiuchi | G06F 1/1616 |
| 2010/0187957 | A1 * | 7/2010 | Liang | G06F 1/187<br>312/223.2 |
| 2011/0292620 | A1 * | 12/2011 | Hayashi | H05K 7/1409<br>361/748 |
| 2012/0240704 | A1 * | 9/2012 | Li | H05K 7/1409<br>74/412 R |
| 2018/0146569 | A1 * | 5/2018 | Schroeder | G11B 33/124 |
| 2022/0295659 | A1 * | 9/2022 | Hsiao | H05K 7/1489 |

* cited by examiner

SWAPPABLE DEVICE AND DATA PROCESSING SYSTEM INCLUDING SUCH SWAPPABLE DEVICE

CROSS-REFERENCE TO RELATED APPLICATION

This utility application claims priority to Taiwan Application Serial Number 111121480, filed Jun. 9, 2022, which is incorporated herein by reference.

BACKGROUND OF THE INVENTION

1. Field of the Invention

The invention relates to a swappable device and a data processing system including such swappable device, and more in particular, to a user-friendly swappable device and a data processing systems including such swappable device.

2. Description of the Prior Art

A general data processing system (for example, a server, etc.) is equipped with a plurality of devices with different functions, for example, a hard disk, an input/output module card, a sound card, a graphics card, a display card, an interface card such as an adapter card, and so on. In the data processing system of the prior art, interface cards with different functions are plugged into connectors such as slots on the motherboard of the data processing system, so as to be electrically connected to the motherboard and fixed on the motherboard. Interface cards with some functions are even directly locked in the chassis of the data processing system with screws. In the data processing system of the prior art, the hard disk is not only connected with the connector of the motherboard, but also directly locked in the carrier frame in the chassis of the data processing system with screws.

With the development of different applications of the data processing system, the design of combining some devices with swappable members into swappable device also emerges as the times require. For example, in the prior art, the slide rails are fixed on both sides of the hard disk with screws, then the hard disk slides into the carrier, and finally the hard disk is fixed by screws or other fixing components.

However, in the structure of the swappable hard disk in the above-mentioned prior art, screws still need to be tightened or loosened, which is cumbersome and inconvenient to operate. Moreover, the carrier takes up space in the chassis, and cannot be used in a data processing system that employs a large number of hard drives for data storage applications. Most of the current enterprises and even the general public will use RAID (Redundant Array of Independent Drives) storage systems or JBOD (Just a Bunch Of Disks) storage systems based on the demand of large amount of data storage and in order to ensure data security. These data processing systems use a large number of hard disk drives and are used as a data storage application.

In another prior art, the swappable members fixed on the interface card can be operated by the user, and the interface card can be moved up and down by using torque, such that the connector of the interface card is inserted into or removed from the connector on the motherboard. However, the torque provided by the swappable members in the prior art is limited, and cannot be applied to interface cards with multiple connectors. Taking the data processing system as a data storage system as an example, its input/output module interface card has been developed to have six high-speed connectors, three power connectors, and one PCIe (peripheral component interface express) interface protocol connector and two guide slots, so many connectors must be inserted into or removed from the corresponding connectors with a relatively large torque. Moreover, the swappable members of the prior art are not designed to avoid excessive operation.

In addition, the swappable devices of the prior art are currently only horizontal swappable devices that can move along the longitudinal direction of the chassis. Currently, there is no development of a vertically swappable device capable of moving along the vertical direction of the chassis. The combination of the vertically swappable device and the horizontally swappable device is expected to reduce the space occupied in the chassis.

In addition, the structure of the swappable device of the prior art still needs to be improved to facilitate frequent maintenance, especially for data processing systems (such as data storage systems) equipped with hot plug devices, which is also beneficial to the user's operation.

SUMMARY OF THE INVENTION

Accordingly, one scope of the invention is to provide a swappable device overcoming the problems in the prior art and a data processing system including such swappable device.

A first swappable device according to a first preferred embodiment of the invention includes a first side cover, a lever, a sliding plate, a functional module interface card, and a second side cover. The first side cover includes a first base plate, a first joint member and a plurality of first guide pillars. The first base plate has a first outer side face, a first inner side face, a first front edge, a first rear edge, a first upper edge, a first lower edge, an arc-shaped first guide groove, and a linear second guide groove. The first joint member is formed on the first inner side face of the first base plate, and extends outward from the first upper edge. The plurality of first guide pillars are formed on the first inner side face of the first base plate. The first guide groove is adjacent to the first front edge of the first base plate, and has a first upper end point and a first lower end point. The first upper end point of the first guide groove is adjacent to the first upper edge of the first base plate. The first guide groove extends from the first upper end point toward the first lower edge of the first base plate to the first lower end point. The second guide groove is located between the first guide groove and the first rear edge of the first base plate, and has a second upper end point and a second lower end point. The second upper end point of the second guide groove is adjacent to the first upper edge of the first base plate. The second guide groove extends from the second upper end point toward the first lower edge of the first base plate to the second lower end point. The lever includes a main pole body, an operating part and a second guide pillar. The main pole body has a tail end, a head end and a linear third guide groove. The tail end of the main pole body is pivotally connected to the first inner side face of the first base plate, and is adjacent to the first rear edge and the first upper edge of the first base plate. The operating part is formed on the head end of the main pole body, and is located outside the first front edge of the first base plate. The second guide pillar is formed on the main pole body, and is capable of being operated in the first guide groove to move between the first upper end point and the first lower end point. The third guide groove is formed between the head end and the tail end of the main pole body, and has a front end point and a rear end point. The front end point of the third guide groove is toward the head end of the main pole body. The third guide groove extends from the front end point toward the tail end of the main pole body to the rear end point. The third guide groove and the second guide groove cross and overlap. The sliding plate includes a second base plate and a third guide pillar. The second base plate has a second outer side face, a second inner side face, a second front edge, a second rear edge, a second upper edge, a second lower edge and a plurality of linear fourth guide grooves. The third guide pillar is formed on the second outer side face of the second base plate. Each fourth guide groove corresponds to one of the first guide pillars, and has a respective third upper end point and a respective third lower end point. The sliding plate is placed on the first inner side face of the first base plate and the main pole body with the second outer side face, such that the third guide pillar of the sliding plate is placed in the third guide groove of the main pole body and the second guide groove of the first base plate, and that each first guide pillar is placed in the corresponding fourth guide groove. The first guide groove of the first base plate is located outside the second front edge of the second base plate. The functional module interface card includes N first connectors, and has a third outer side face, a third inner side face, a third front edge, a third rear edge, a third upper edge, and a third lower edge, where N is an integer larger than 1. The N first connectors are formed at the third lower edge of the functional module interface card. The functional module interface card is mounted on the second inner side face of the second base plate with the third outer side face. The third rear edge of the functional module interface card and the second rear edge of the second base plate are adjacent to the first rear edge of the first base plate. The third upper edge of the functional module interface card and the second upper edge of the second base plate are adjacent to the first upper edge of the first base plate. The second side cover includes a third base plate, a front shield and a rear shield. The third base plate has a fourth outer side face, a fourth inner side face, a fourth front edge, a fourth rear edge, a fourth upper edge, a fourth lower edge and a joint portion. The front shield is formed on the fourth outer side face of the third base plate and extends outward from the fourth front edge. The rear shield is formed on the fourth outer side face of third base plate and extends outward from the fourth rear edge. The joint portion of the second side cover is located adjacent to the fourth upper edge, and is fixed with the first joint member of the first side cover, such that the rear shield cover the third rear edge and the second rear edge, and that the front shield and the first front edge of the first base plate constitute a slit. The head end of the main pole body passes through the slit. When a user operates the operating part of the lever to rotate the main pole body to move the second guide pillar to the first upper end point of the first guide groove of the first base plate, the third guide pillar of the sliding plate moves toward the front end point of the third guide groove of the main pole body and the second upper end point of the second guide groove of the first base plate. Each first guide pillar moves toward the third lower end point of the corresponding fourth guide groove. At this time, the sliding plate is actuated to drive the functional module interface card to move toward the first upper edge relative to the first base plate until the N first connectors are at a closest position relative to the first upper edge of the first base plate. When the user operates the operating part of the lever to rotate the main pole body to move the second guide pillar to the first lower end point of the first guide groove, the third guide pillar of the sliding plate moves toward the rear end point of the third guide groove of the main pole body and the second lower end point of the second guide groove of the first base plate. Each first guide pillar moves toward the third upper end point of the corresponding fourth guide groove. At this time, the sliding plate is actuated to drive the functional module interface card to move toward the first lower edge relative to the first base plate until the N first connectors are at a farthest position relative to the first upper edge of the first base plate.

A second swappable device according to a second preferred embodiment of the invention includes a side cover, a lever, an operating member and a functional component. The side cover includes a base plate, a front side plate, an upper side plate and a rear side plate. The base plate has an outer side face, an inner side face, a front edge, a rear edge, an upper edge and a lower edge. The front side plate is formed on the inner side face of the base plate and extends outward from the front edge. The upper side plate is formed on the inner side face of the base plate and extends outward from the upper edge. The rear side plate is formed on the inner side face of the base plate and extends outward from the rear edge. The rear side plate thereon has at least one engaging hole. The lever has a head end and a tail end. The lever is pivotally connected to the upper side plate via the tail end. The operating member is mounted on the head end of the lever. The functional component includes a casing and at least one engaging rod. The at least one engaging rod is formed on the casing. Each engaging rod corresponds to one of the at least one engaging hole. The casing fits in the side cover, such that each engaging rod is releasably engaged with the corresponding engaging hole.

A data processing system according to a third preferred embodiment of the invention includes a chassis, a motherboard and at least one first swappable device according to the invention. The chassis includes a front panel, a rear panel, a bottom panel, a first side panel, a second side panel and a top cover. The front panel, the rear panel, the bottom panel, the first side panel and the second side panel constitute an accommodating space. The top cover covers the accommodating space, and is capable of sliding relative to the first side panel and the second side panel. The front panel thereon has at least one window. The motherboard is mounted on the bottom panel, and includes at least one set of N second connectors, where N being an integer larger than 1. Each set of N second connectors correspond to one of at least one window, and are arranged in a straight line behind the corresponding window. When the lever of one of the at least one first swappable device is operated to move the second guide pillar of the lever to the first upper end point of the first guide groove of the first base plate, said one first swappable device is inserted into the accommodating space from one of the at least one window such that the front shield of said one first swappable device fits into said one window. When the lever of said one first swappable device is operated to move the second guide pillar of the lever to the first lower end point of the first guide groove of the first base plate, the N first connectors of said one first swappable device are at the farthest position relative to the first upper edge of the first base plate to be mated with the set of N second connectors corresponding to said one window.

Further, the data processing system according to the third preferred embodiment of the invention also includes a plurality of second swappable devices. The motherboard also includes a plurality of third connectors. Each second swappable device corresponds to one of the plurality of third connectors. The functional component of each second swappable device further includes a fourth connector. The side cover of each second swappable device further includes at least one guide rib formed on the rear side plate. Each second swappable device is installed in the accommodating space by mating the fourth connector with the corresponding third connector. The front side plate of each second swappable device installed in the accommodation space faces the front panel of the chassis. Between two adjacent second swappable devices, the front side plate of said one second swappable device away from the front panel of the chassis is fitted between at least one guide rib of said one second swappable device close to the front panel of the chassis. When the top cover of the chassis is slid to expose the accommodating space of the chassis, the operating member of one of the plurality of second swappable devices is capable of being operated to rotate the lever of said one second swappable device upwards so as to disengage the fourth connector from the corresponding third connector and thereby to pull out said one second swappable device.

Different from the prior art, the swappable device according to the invention can provide a larger torque, and then can be easily inserted into or removed from the corresponding connector. Moreover, the swappable device according to the invention is easy to operate and can avoid excessive operation. The data processing system using the swappable device according to the invention can greatly reduce the space occupied in the chassis of the data processing system, and facilitates frequent maintenance, and can be equipped with hot plug devices.

The advantage and spirit of the invention may be understood by the following recitations together with the appended drawings.

BRIEF DESCRIPTION OF THE APPENDED DRAWINGS

DETAILED DESCRIPTION OF THE INVENTION

Some preferred embodiments and practical applications of this present invention would be explained in the following paragraph, describing the characteristics, spirit, and advantages of the invention.

Figure 1:
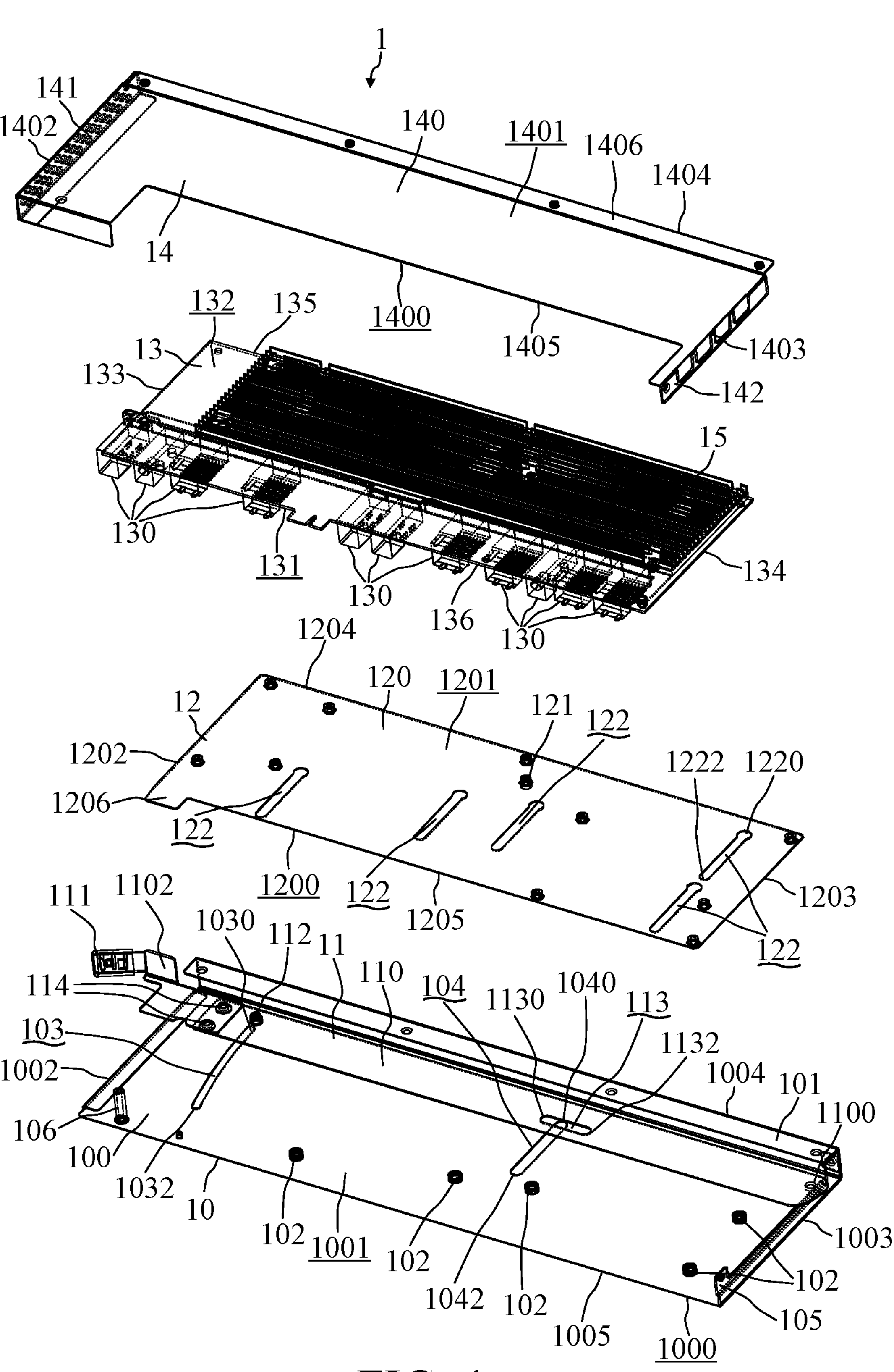
FIG. 1 is an explosive view of components and members of the first swappable device according to the first preferred embodiment of the invention.
Figure 2:
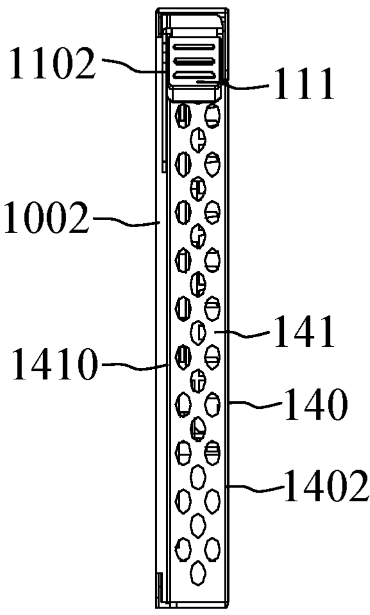
FIG. 2 is a front view of the first swappable device according to the first preferred embodiment of the invention.
Figure 3:
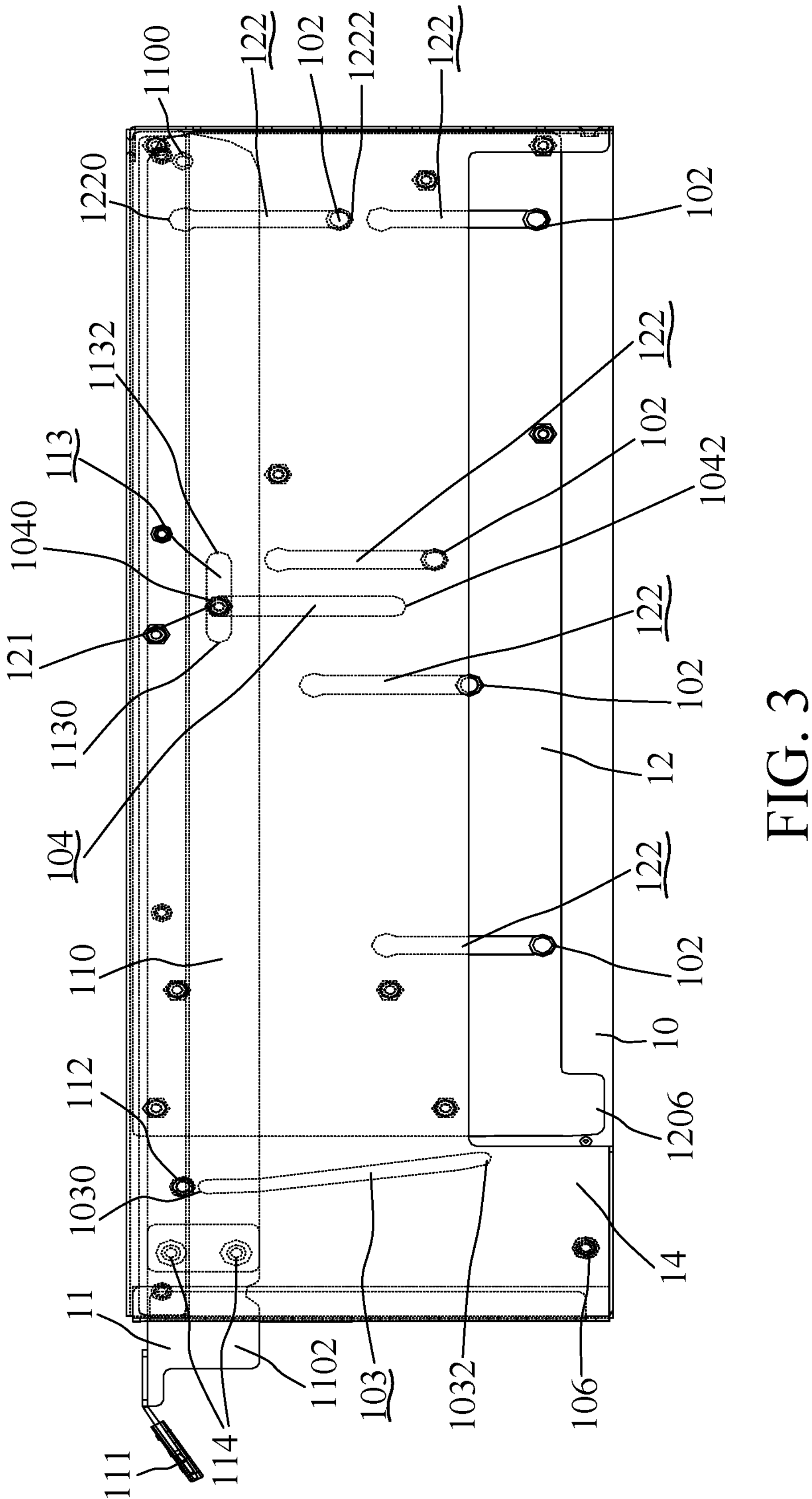
FIG. 3 is a side view of the first swappable device according to the first preferred embodiment of the invention after a functional module interface card is removed and an operating part of a lever is at the uppermost position.
Figure 4:
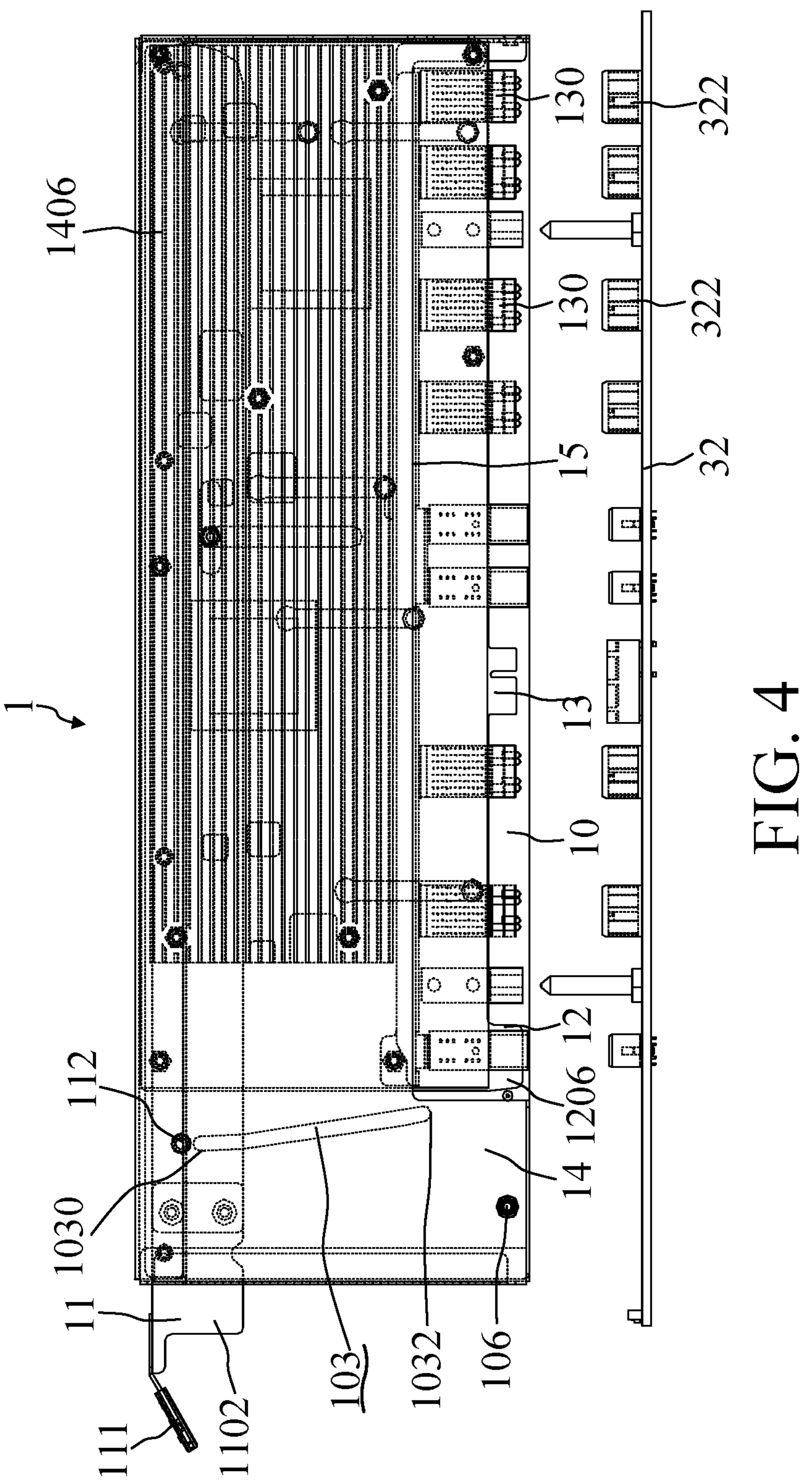
FIG. 4 is a schematic diagram of the engagement relationship between the operating part of the lever of the first swappable device according to the first preferred embodiment of the invention and a motherboard when the operating part of the lever is at the uppermost position.
Figure 5:
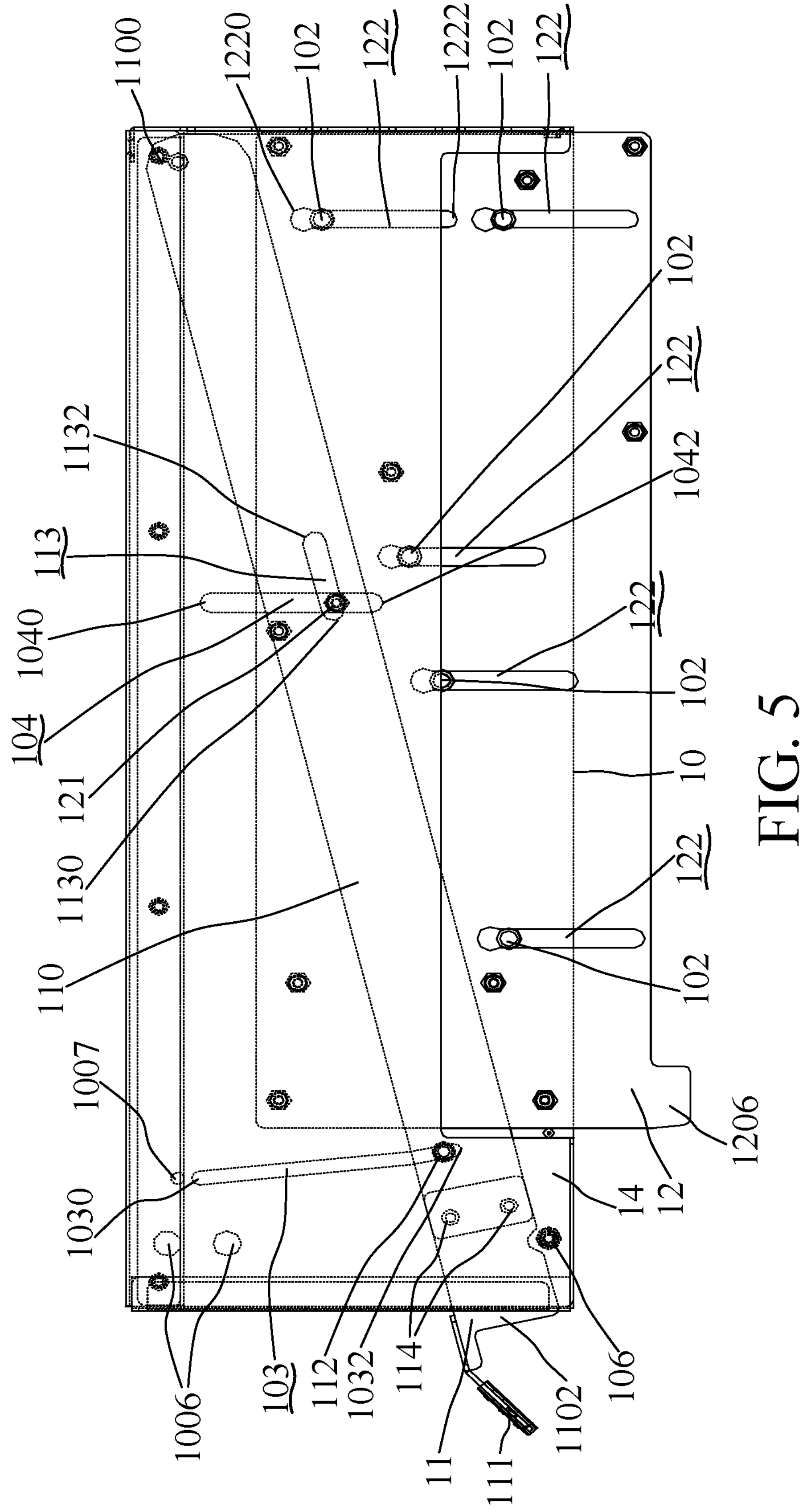
FIG. 5 is a side view of the first swappable device according to the first preferred embodiment of the invention after the functional module interface card is removed and the operating part of the lever is at the lowest position.
Figure 6:
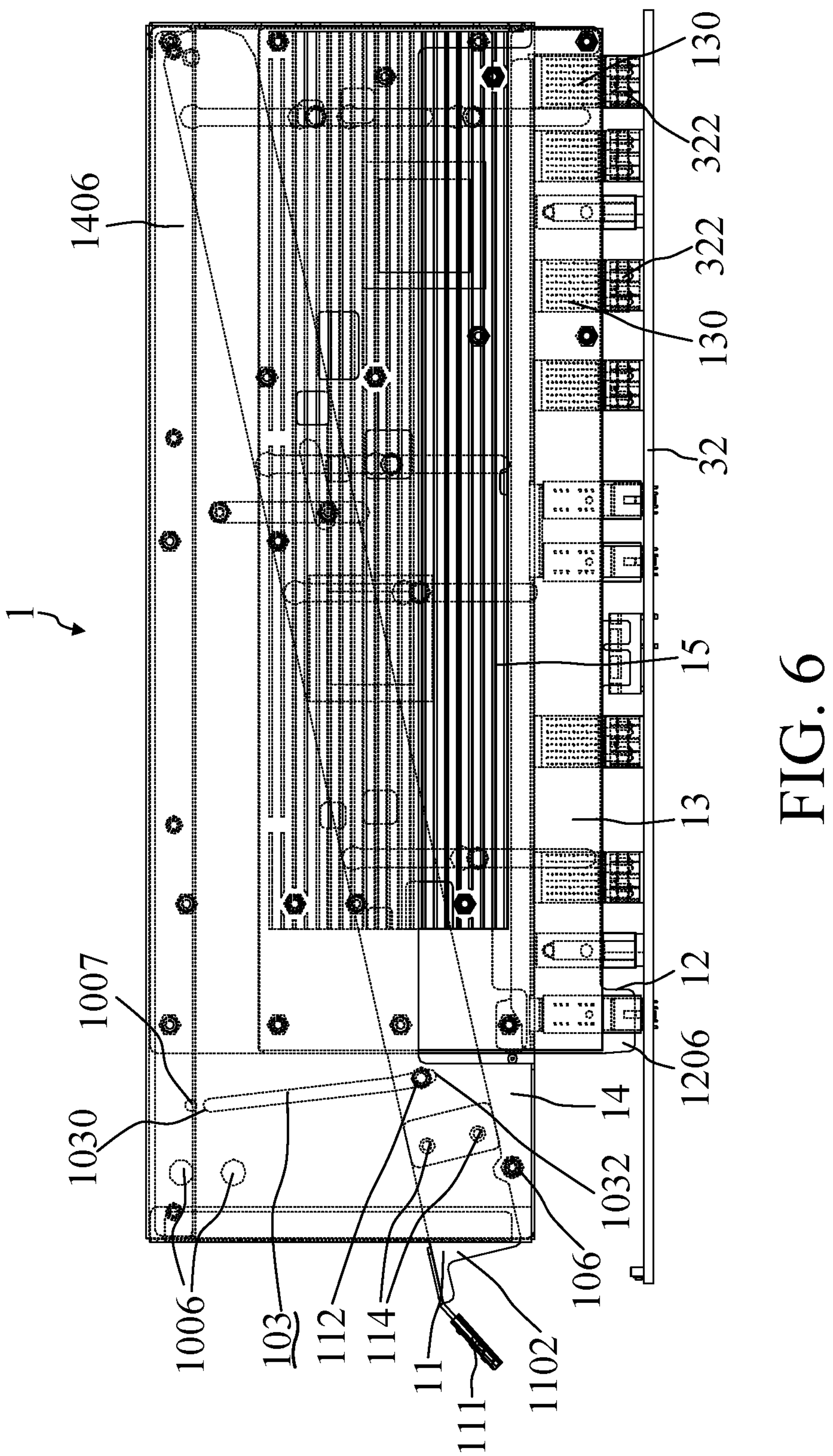
FIG. 6 is a schematic diagram of the engagement relationship between the operating part of the lever of the first swappable device according to the first preferred embodiment of the invention and the motherboard when the operating part of the lever is at the lowest position.

Referring to FIG. 1 to FIG. 6, those drawings schematically illustrate the first swappable device 1 according to the first preferred embodiment of the invention. FIG. 1 is an explosive view of components and members of the first swappable device 1 according to the first preferred embodiment of the invention. FIG. 2 is a front view of the first swappable device 1 according to the first preferred embodiment of the invention. FIG. 3 is a side view of the first swappable device 1 according to the first preferred embodiment of the invention after a functional module interface card 13 is removed and an operating part 111 of a lever 11 is at the uppermost position. FIG. 4 is a schematic diagram of the engagement relationship between the operating part 111 of the lever 11 of the first swappable device 1 according to the first preferred embodiment of the invention and a motherboard 32 when the operating part 111 of the lever 11 is at the uppermost position. FIG. 5 is a side view of the first swappable device 1 according to the first preferred embodiment of the invention after the functional module interface card 13 is removed and the operating part 111 of the lever 11 is at the lowest position. FIG. 6 is a schematic diagram of the engagement relationship between the operating part 111 of the lever 11 of the first swappable device 1 according to the first preferred embodiment of the invention and the motherboard 32 when the operating part 111 of the lever 11 is at the lowest position.

The first swappable device 1 according to the first preferred embodiment of the invention is a horizontal swappable device, that is to say the first swappable device 1 according to the first preferred embodiment of the invention is inserted into or detached from a chassis along the longitudinal direction of the chassis of a data processing system.

As shown in FIG. 1 to FIG. 6, the first swappable device 1 according to the first preferred embodiment of the invention includes a first side cover 10, a lever 11, a sliding plate 12, a functional module interface card 13, and a second side cover 14.

The first side cover 10 includes a first base plate 100, a first joint member 101 and a plurality of first guide pillars 102. The first base plate 100 has a first outer side face 1000, a first inner side face 1001, a first front edge 1002, a first rear edge 1003, a first upper edge 1004, a first lower edge 1005, an arc-shaped first guide groove 103, and a linear second guide groove 104. The first joint member 101 is formed on the first inner side face 1001 of the first base plate 100, and extends outward from the first upper edge 1004. The plurality of first guide pillars 102 are formed on the first inner side face 1001 of the first base plate 100. The first guide groove 103 is adjacent to the first front edge 1002 of the first base plate 100, and has a first upper end point 1030 and a first lower end point 1032. The first upper end point 1030 of the first guide groove 103 is adjacent to the first upper edge 1004 of the first base plate 100. The first guide groove 103 extends from the first upper end point 1030 toward the first lower edge 1005 of the first base plate 100 to the first lower end point 1032. The second guide groove 104 is located between the first guide groove 103 and the first rear edge 1003 of the first base plate 100, and has a second upper end point 1040 and a second lower end point 1042. The second upper end point 1040 of the second guide groove 104 is adjacent to the first upper edge 1004 of the first base plate 100. The second guide groove 104 extends from the second upper end point 1040 toward the first lower edge 1005 of the first base plate 100 to the second lower end point 1042.

The lever 11 includes a main pole body 110, an operating part 111 and a second guide pillar 112. The main pole body 110 has a tail end 1100, a head end 1102 and a linear third guide groove 113. The tail end 1100 of the main pole body 110 is pivotally connected to the first inner side face 1001 of the first base plate 100, and is adjacent to the first rear edge 1003 and the first upper edge 1004 of the first base plate 100. The operating part 111 is formed on the head end 1102 of the main pole body 110, and is located outside the first front edge 1002 of the first base plate 100. The second guide pillar 112 is formed on the main pole body 110, and is capable of being operated in the first guide groove 103 to move between the first upper end point 1030 and the first lower end point 1032. The third guide groove 113 is formed between the head end 1102 and the tail end 1100 of the main pole body 110, and has a front end point 1130 and a rear end point 1132. The front end point 1130 of the third guide groove 113 is toward the head end 1102 of the main pole body 110. The third guide groove 113 extends from the front end point 1130 toward the tail end 1100 of the main pole body 110 to the rear end point 1132. The third guide groove 113 and the second guide groove 104 cross and overlap.

The sliding plate 12 includes a second base plate 120 and a third guide pillar 121. The second base plate 120 has a second outer side face 1200, a second inner side face 1201, a second front edge 1202, a second rear edge 1203, a second upper edge 1204, a second lower edge 1205 and a plurality of linear fourth guide grooves 122. The third guide pillar 121 is formed on the second outer side face 1200 of the second base plate 120. Each fourth guide groove 122 corresponds to one of the first guide pillars 102, and has a respective third upper end point 1220 and a respective third lower end point 1222. The sliding plate 12 is placed on the first inner side face 1001 of the first base plate 100 and the main pole body 110 with the second outer side face 1200, such that the third guide pillar 121 of the sliding plate 12 is placed in the third guide groove 113 of the main pole body 110 and the second guide groove 104 of the first base plate 100, and that each first guide pillar 102 is placed in the corresponding fourth guide groove 122. The first guide groove 103 of the first base plate 100 is located outside the second front edge 1202 of the second base plate 120.

The functional module interface card 13 includes N first connectors 130, and has a third outer side face 131, a third inner side face 132, a third front edge 133, a third rear edge 134, a third upper edge 135, and a third lower edge 136, where N is an integer larger than 1. The N first connectors 130 are formed at the third lower edge 136 of the functional module interface card 13.

An example of the functional module interface card 13 is used as an input/output module interface card of a data storage system. The functional module interface card 13 of the example has been developed to have six high-speed connectors, three power connectors, and one PCIe interface protocol connector and two guide slots.

The functional module interface card 13 is mounted on the second inner side face 1201 of the second base plate 120 with the third outer side face 131. The third rear edge 134 of the functional module interface card 13 and the second rear edge 1203 of the second base plate 120 are adjacent to the first rear edge 1003 of the first base plate 100. The third upper edge 135 of the functional module interface card 13 and the second upper edge 1204 of the second base plate 120 are adjacent to the first upper edge 1004 of the first base plate 100.

The second side cover 14 includes a third base plate 140, a front shield 141 and a rear shield 142. The third base plate 140 has a fourth outer side face 1400, a fourth inner side face 1401, a fourth front edge 1402, a fourth rear edge 1403, a fourth upper edge 1404, a fourth lower edge 1405 and a joint portion 1406. The front shield 141 is formed on the fourth outer side face 1400 of the third base plate 140 and extends outward from the fourth front edge 1402. The rear shield 142 is formed on the fourth outer side face 1400 of third base plate 140 and extends outward from the fourth rear edge 1403. The joint portion 1406 of the second side cover 14 is located adjacent to the fourth upper edge 1404, and is fixed with the first joint member 101 of the first side cover 10, such that the rear shield 142 cover the third rear edge 134 and the second rear edge 1203, and that the front shield 141 and the first front edge 1002 of the first base plate 100 constitute a slit 1410. The head end 1102 of the main pole body 110 passes through the slit 1410. The front shield 141 thereon has a plurality of through holes to facilitate the heat dissipation of the functional module interface card 13.

When a user operates the operating part 111 of the lever 11 to rotate the main pole body 110 to move the second guide pillar 112 to the first upper end point 1030 of the first guide groove 103 of the first base plate 100, that is to say, when the user operates the operating part 111 of the lever 11 to pull the lever 11 upwards, the third guide pillar 121 of the sliding plate 12 moves toward the front end point 1130 of the third guide groove 113 of the main pole body 110 and the second upper end point 1040 of the second guide groove 104 of the first base plate 100. Each first guide pillar 102 moves toward the third lower end point 1222 of the corresponding fourth guide groove 122. At this time, the sliding plate 12 is actuated to drive the functional module interface card 13 to move toward the first upper edge 1004 relative to the first base plate 100 until the N first connectors 130 are at the closest position relative to the first upper edge 1004 of the first base plate 100. Also at this time, if the first swappable device 1 according to the first preferred embodiment of the invention is located above the motherboard 32, the operating part 111 of the lever 11 is pulled to the uppermost position, and the N first the connector 130 is detached from the N second connectors 322 of the motherboard 32, as shown in FIG. 4.

When the user operates the operating part 111 of the lever 11 to rotate the main pole body 110 to move the second guide pillar 112 to the first lower end point 1032 of the first guide groove 103, that is to say, when the user operates the operating part 111 of the lever 11 to pull the lever 11 downwards, the third guide pillar 121 of the sliding plate 12 moves toward the rear end point 1132 of the third guide groove 113 of the main pole body 110 and the second lower end point 1042 of the second guide groove 104 of the first base plate 100.

Each first guide pillar 102 moves toward the third upper end point 1220 of the corresponding fourth guide groove 122. At this time, the sliding plate 12 is actuated to drive the functional module interface card 13 to move toward the first lower edge 1005 relative to the first base plate 100 until the N first connectors 130 are at the farthest position relative to the first upper edge 1004 of the first base plate 100. Also at this time, if the first swappable device 1 according to the first preferred embodiment of the invention is located above the motherboard 32, the operating part 111 of the lever 11 is pulled to the lowest position, and the N first connectors 130 are connected to the N second connectors 322 of the motherboard 32, as shown in FIG. 6.

It should be noted that the distribution and arrangement of the plurality of linear fourth guide grooves 122 of the sliding plate 12 allow the functional module interface card 13 to be moved up and down smoothly.

In one embodiment, the second base plate 120 of the sliding plate 12 also has a protrusion 1206. The protrusion 1206 extends downward from the second lower edge 1205 of the second base plate 120, and is adjacent to the second front edge 1202. The end of the protrusion 1206 are substantially at the same level as the N first connectors 130. When the N first connectors 130 are connected to other connectors, the protrusion 1206 assists in positioning and applying force.

Further, the first swappable device 1 according to the first preferred embodiment of the invention also includes a heat-dissipating component 15. The heat-dissipating component 15 is mounted on the third inner side face 132 of the functional module interface card 13 to assist the functional module interface card 13 in dissipating heat. The third base plate 140 and the rear shield 142 cover the heat-dissipating component 15.

In one embodiment, the first side cover 10 further includes a second joint member 105. The second joint member 105 is formed on the first inner side face 1001 of the first base plate 100, and extends outward from the first rear edge 1003. The rear shield 142 is fixed together with the second joint member 105.

In one embodiment, the first side cover 10 further includes a blocking rod 106. The blocking rod 106 is formed on the first inner side face 1001 of the first base plate 100, and is adjacent to the first lower edge 1005 of the first base plate 100. When the second guide pillar 112 of the lever 11 moves to the first lower end point 1032 of the first guide groove 103 of the first base plate 100, a lower edge of the main pole body 110 is blocked by the blocking rod 106. Thereby, the first swappable device 1 according to the first preferred embodiment of the invention can avoid excessive operation.

In one embodiment, the first base plate 100 also has at least one engaging hole 1006. The at least one engaging hole 1006 is adjacent to the first upper edge 1004 of the first base plate 100 and the first upper end point 1030 of the first guide groove 103. The lever 11 further includes at least one engaging rod 114. Each engaging rod 114 is formed on the main pole body 110, and corresponds to one of the at least one engaging hole 1006. Each engaging rod 114 of the lever 11 is releasably engaged with the corresponding engaging hole 1006. Thereby, the first swappable device 1 according to the first preferred embodiment of the invention can keep the N first connectors 130 at the closest position relative to the first upper edge 1004 of the first baseplate 100 during operation. The first base plate 100 may also have an engaging hole 1007 located between the first upper edge 1004 of the first base plate 100 and the first upper end point 1030 of the first guide groove 103. The second guide pillar 112 of the lever 11 is releasably engaged with the engaging hole 1007 of the first base plate 100.

Figure 7:
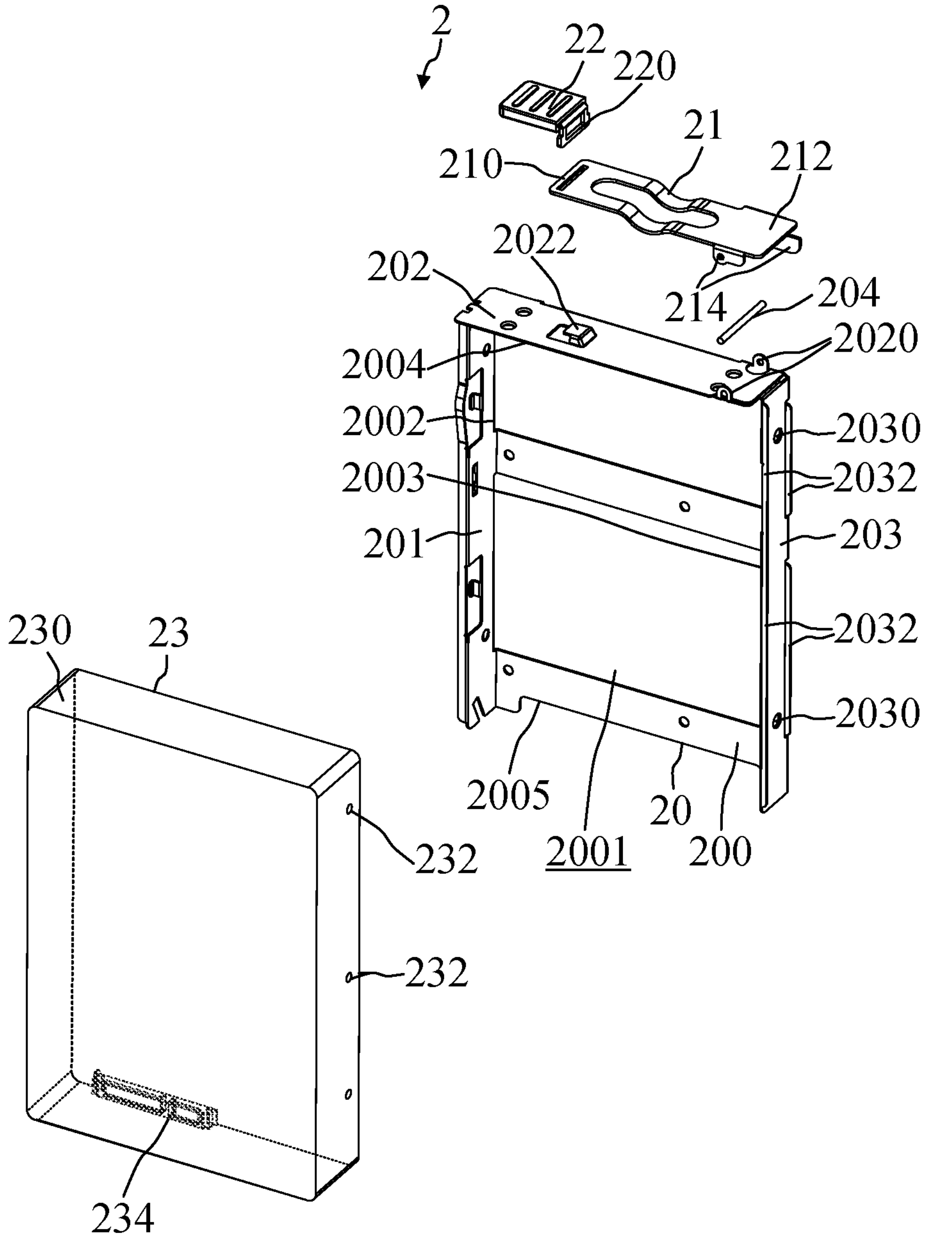
FIG. 7 is an explosive view of components and members of the second swappable device according to the second preferred embodiment of the invention.
Figure 8:
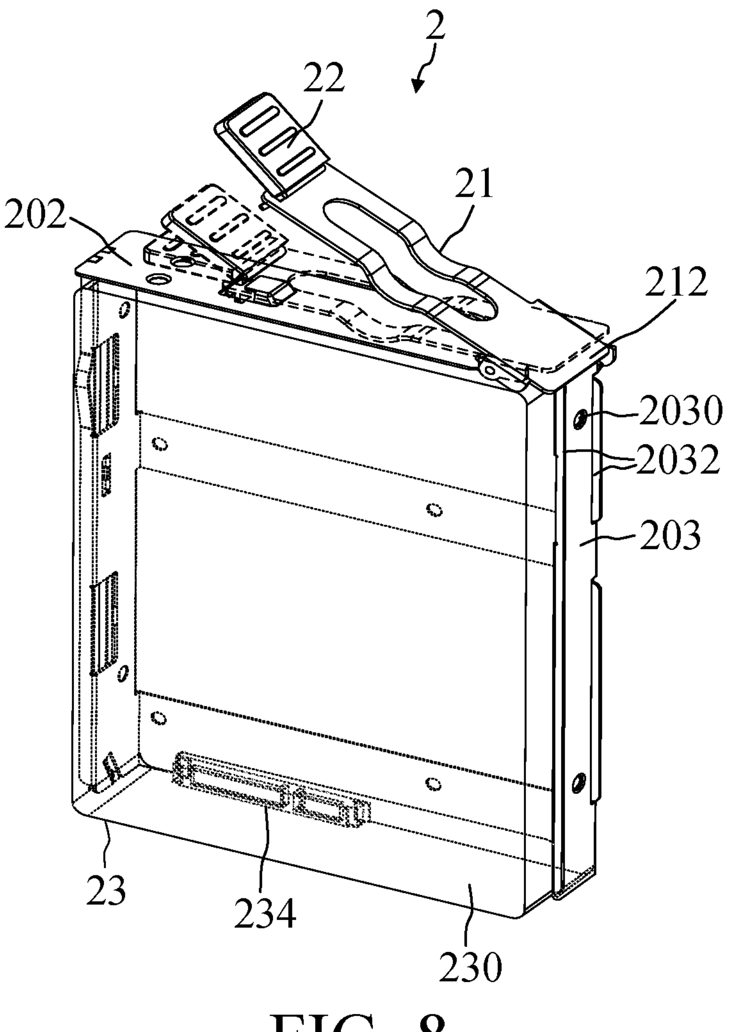
FIG. 8 is a perspective view of the second swappable device according to the second preferred embodiment of the invention.

Referring to FIG. 7 and FIG. 8, those drawings schematically illustrate the second swappable device 2 according to the second preferred embodiment of the invention. FIG. 7 is an explosive view of components and members of the second swappable device 2 according to the second preferred embodiment of the invention. FIG. 8 is a perspective view of the second swappable device 2 according to the second preferred embodiment of the invention. The second swappable device 2 according to the second preferred embodiment of the invention is a vertical swappable device, that is to say the second swappable device 2 according to the second preferred embodiment of the invention is inserted into or detached from a chassis along the vertical direction of the chassis of a data processing system.

As shown in FIG. 7 and FIG. 8, the second swappable device 2 according to a second preferred embodiment of the invention includes a side cover 20, a lever 21, an operating member 22 and a functional component 23.

The side cover 20 includes a base plate 200, a front side plate 201, an upper side plate 202 and a rear side plate 203. The base plate 200 has an outer side face 2000, an inner side face 2001, a front edge 2002, a rear edge 2003, an upper edge 2004 and a lower edge 2005. The front side plate 201 is formed on the inner side face 2001 of the base plate 200 and extends outward from the front edge 2002. The upper side plate 202 is formed on the inner side face 2001 of the base plate 200 and extends outward from the upper edge 2004. The rear side plate 203 is formed on the inner side face 2001 of the base plate 200 and extends outward from the rear edge 2003. The rear side plate 203 thereon has at least one engaging hole 2030.

The lever 21 has a head end 210 and a tail end 212. The lever 21 is pivotally connected to the upper side plate 202 via the tail end 212. For example, in the example shown in FIG. 7, the lever 21 also has a first pivotal part 214 formed at the tail end 212, and the upper side plate 202 has a second pivotal part 2020 thereon. The lever 21 is pivotally connected to the upper side plate 202 by inserting a latch 204 into the first pivotal portion 214 and the second pivotal part 2020. The operating member 22 is mounted on the head end 210 of the lever 21.

The functional component 23 includes a casing 230 and at least one engaging rod 232. The at least one engaging rod 232 is formed on the casing 230. Each engaging rod 232 corresponds to one of the at least one engaging hole 2030. The casing 230 fits in the side cover 20, such that each engaging rod 232 is releasably engaged with the corresponding engaging hole 2030. The second swappable device 2 according to the second preferred embodiment of the invention is operated to be inserted into or removed from the chassis of the data processing system along the vertical direction, which will be described in detail hereinafter.

In one embodiment, the functional component 23 can be a hard disk, but the invention is not limited thereto.

In one embodiment, the upper side plate 202 has a hook-shaped portion 2022 extending upwards. The operating member 22 has a button-shaped portion 220 extending downwards. The button-shaped portion 220 is releasably engaged with the hook-shaped portion 2022. Before the user operates the lever 21, the button-shaped portion 220 of the operating member 22 needs to be detached from the hook-shaped portion 2022 of the upper side plate 202.

Figure 9:
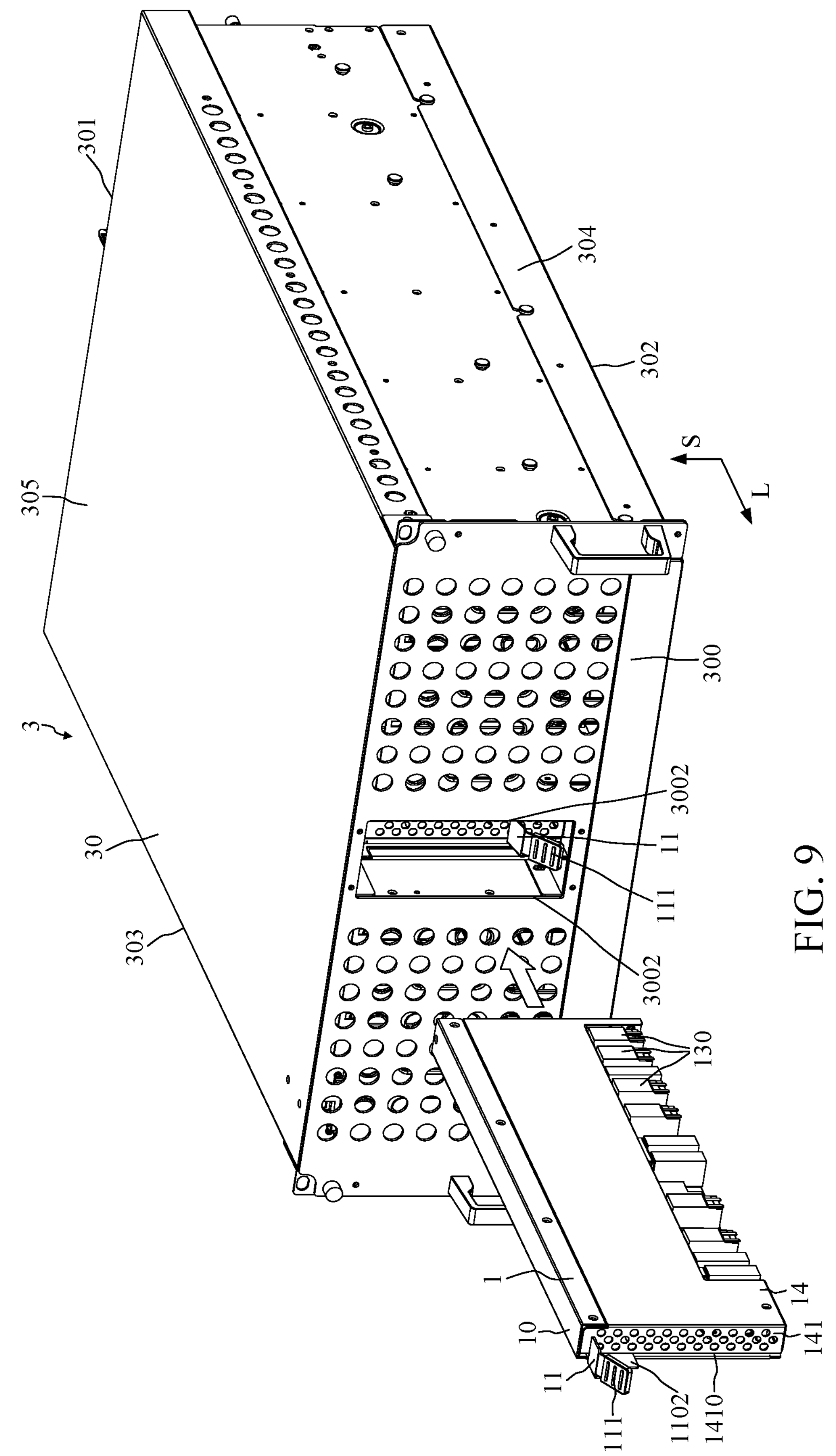
FIG. 9 is a perspective view of the data processing system according to the third preferred embodiment of the invention.
Figure 10:
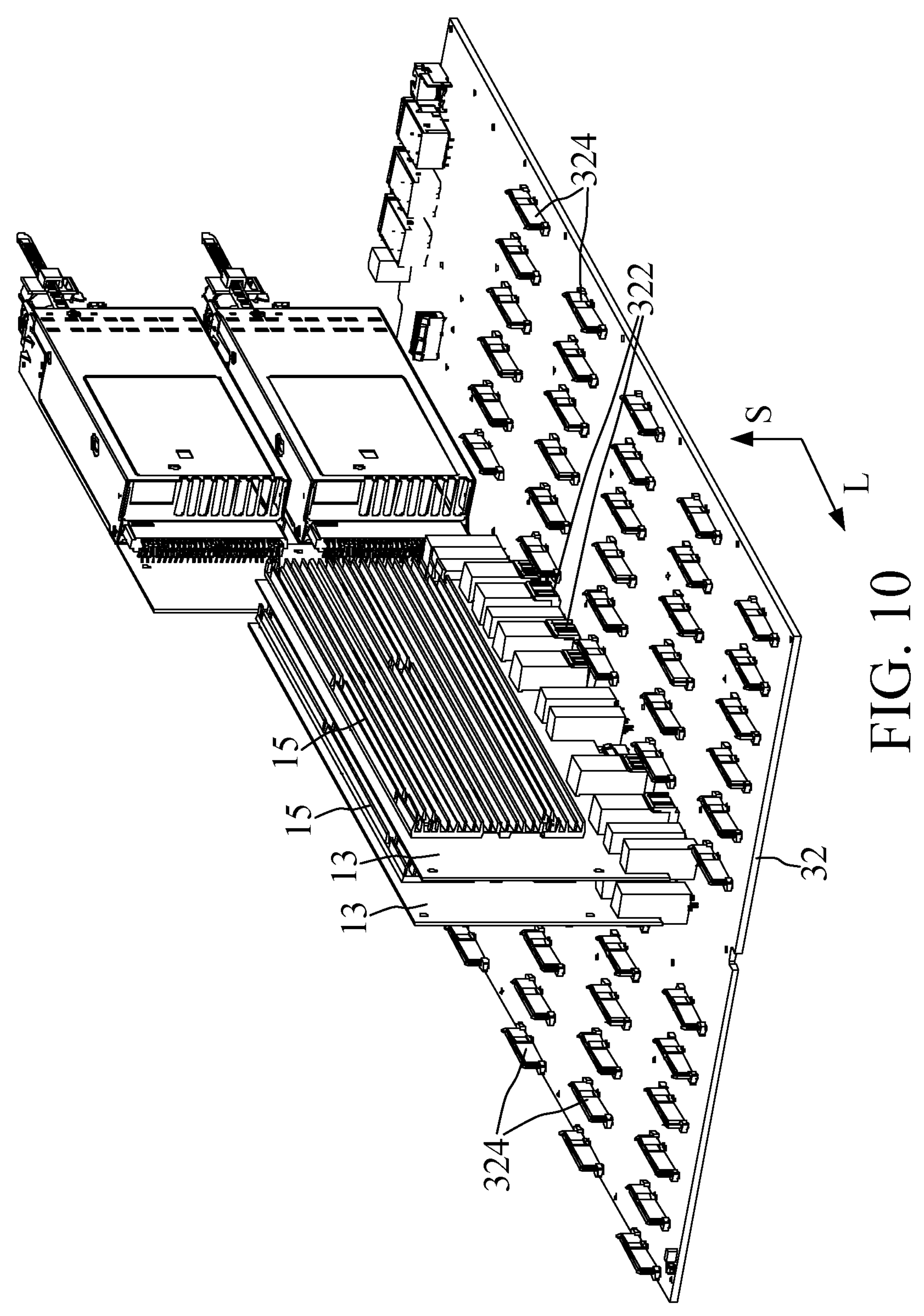
FIG. 10 is a perspective view of a motherboard and a functional module interface card of the data processing system according to the third preferred embodiment of the invention.
Figure 11:
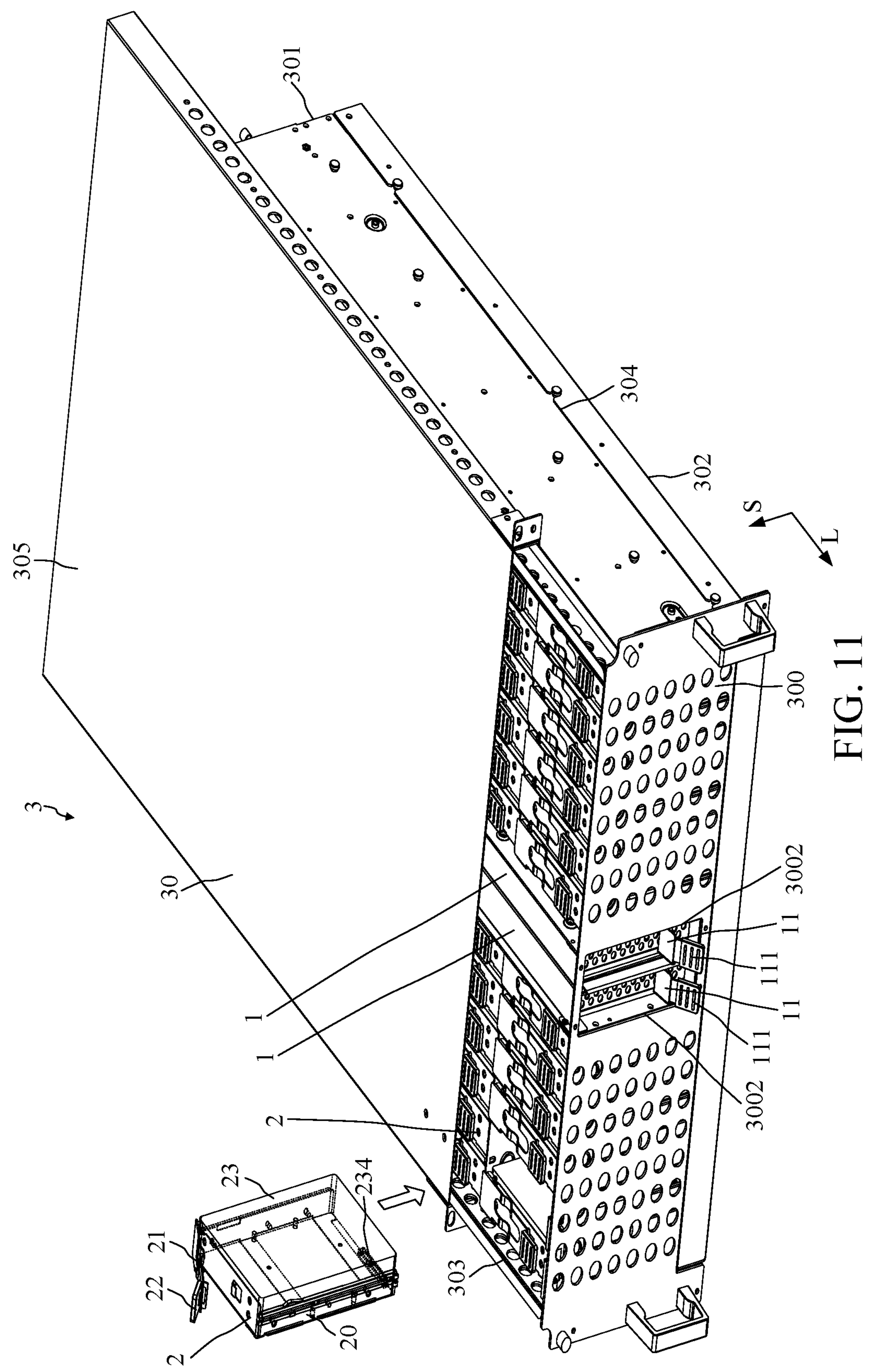
FIG. 11 is another perspective view of the data processing system according to the third preferred embodiment of the invention.

Referring to FIG. 9 to FIG. 11, those drawings schematically illustrate a data processing system 3 according to the third preferred embodiment of the invention. FIG. 9 is a perspective view of the data processing system 3 according to the third preferred embodiment of the invention. FIG. 10 is a perspective view of a motherboard 32 and a functional module interface card 13 of the data processing system 3 according to the third preferred embodiment of the invention. FIG. 11 is another perspective view of the data processing system 3 according to the third preferred embodiment of the invention.

As shown in FIG. 9 to FIG. 11, the data processing system 3 according to the third preferred embodiment of the invention includes a chassis 30, a motherboard 32 and at least one first swappable device 1. In the example as shown in FIG. 9 and FIG. 11, two first swappable devices 1 are shown as representatives.

The chassis 30 defines a longitudinal direction L as well as a vertical direction S. The chassis 30 includes a front panel 300, a rear panel 301, a bottom panel 302, a first side panel 303, a second side panel 304 and a top cover 305. The front panel 300, the rear panel 301, the bottom panel 302, the first side panel 303 and the second side panel 304 constitute an accommodating space 306. The top cover 305 covers the accommodating space 306, and is capable of sliding relative to the first side panel 303 and the second side panel 304. The front panel 300 thereon has at least one window 3002.

As shown in FIG. 10, the motherboard 32 is mounted on the bottom panel 302, and includes at least one set of N second connectors 322, where N being an integer larger than 1. Each set of N second connectors 322 correspond to one of at least one window 3002, and are arranged in a straight line behind the corresponding window 3002, that is to say said one set of N second connectors 322 are arranged along the longitudinal direction L.

When the lever 11 of one of the at least one first swappable device 1 is operated to move the second guide pillar 112 of the lever 11 to the first upper end point 1030 of the first guide groove 103 of the first base plate 100, said one first swappable device 1 is inserted into the accommodating space 306 from one of the at least one window 3002 along the longitudinal direction L such that the front shield 141 of said one first swappable device 1 fits into said one window 3002. When the lever 11 of said one first swappable device 1 is operated to move the second guide pillar 112 of the lever 11 to the first lower end point 1032 of the first guide groove 103 of the first base plate 100, the N first connectors 130 of said one first swappable device 1 are at the farthest position relative to the first upper edge 1004 of the first base plate 100 to be mated with the set of N second connectors 322 corresponding to said one window 3002.

In the example as shown in FIG. 9 and FIG. 11, if the data processing system 3 according to the third preferred embodiment of the invention is used as a data storage system, one of the two first swappable devices 1 is used as a master I/O module interface card, and the other of the two first swappable devices 1 is used as a secondary I/O module interface card. When one of the two first swappable devices 1 is pulled out, the data processing system 3 according to the third preferred embodiment of the invention can still maintain operation by the other of the two first swappable devices 1.

Further, the data processing system 3 according to the third preferred embodiment of the invention also includes a plurality of second swappable devices 2. The motherboard 32 also includes a plurality of third connectors 324. As shown in FIG. 10, the plurality of third connectors 324 on the motherboard 32 are arranged in a matrix. Therefore, it is impossible to use a horizontal swappable device for the device matching the third connector 324 arranged in the matrix, only a vertical swappable device can be used. Each second swappable device 2 corresponds to one of the plurality of third connectors 324. The functional component 23 of each second swappable device 2 further includes a fourth connector 234. The side cover 20 of each second swappable device 2 further includes at least one guide rib 2032 formed on the rear side plate 203. Each second swappable device 2 is inserted into the accommodating space 306 along the vertical direction S, and is installed in the accommodating space 306 of the chassis 30 by mating the fourth connector 234 with the corresponding third connector 324. The front side plate 201 of each second swappable device 2 installed in the accommodation space 306 faces the front panel 300 of the chassis 30. Between two adjacent second swappable devices 2, the front side plate 201 of said one second swappable device 2 away from the front panel 300 of the chassis 30 is fitted between at least one guide rib 2032 of said one second swappable device 2 close to the front panel 300 of the chassis 30.

When the top cover 305 of the chassis 30 is slid to expose the accommodating space 306 of the chassis 30, the operating member 22 of one of the plurality of second swappable devices 2 is capable of being operated to rotate the lever 21 of said one second swappable device 2 upwards so as to disengage the fourth connector 234 from the corresponding third connector 324 and thereby to pull out said one second swappable device 2.

With the detailed description of the above preferred embodiments of the invention, it is clear to understand that the swappable device according to the invention can provide a larger torque, and then can be easily inserted into or removed from the corresponding connector. Moreover, the swappable device according to the invention is easy to operate and can avoid excessive operation. The data processing system using the swappable device according to the invention can greatly reduce the space occupied in the chassis of the data processing system, and facilitates frequent maintenance, and can be equipped with hot plug devices.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A swappable device, comprising:

a first side cover, comprising a first base plate, a first joint member and a plurality of first guide pillars, the first base plate having a first outer side face, a first inner side face, a first front edge, a first rear edge, a first upper edge, a first lower edge, an arc-shaped first guide groove, and a linear second guide groove, the first joint member being formed on the first inner side face and extending outward from the first upper edge, the plurality of first guide pillars being formed on the first inner side face, the first guide groove being adjacent to the first front edge and having a first upper end point and a first lower end point, the first upper end point being adjacent to the first upper edge, the first guide groove extending from the first upper end point toward the first lower edge to the first lower end point, the second guide groove being located between the first guide groove and the first rear edge and having a second upper end point and a second lower end point, the second upper end point being adjacent to the first upper edge, and the second guide groove extending from the second upper end point toward the first lower edge to the second lower end point;

a lever, comprising a main pole body, an operating part and a second guide pillar, the main pole body having a tail end, a head end and a linear third guide groove, the tail end being pivotally connected to the first inner side face and being adjacent to the first rear edge and the first upper edge of the first base plate, the operating part being formed on the head end and being located outside the first front edge of the first base plate, the second guide pillar being formed on the main pole body and being capable of being operated in the first guide groove to move between the first upper end point and the first lower end point, the third guide groove being formed between the head end and the tail end and having a front end point and a rear end point, the front end point being toward the head end, the third guide groove extending from the front end point toward the tail end to the rear end point, and the third guide groove and the second guide groove crossing and overlapping;

a sliding plate, comprising a second base plate and a third guide pillar, the second base plate having a second outer side face, a second inner side face, a second front edge, a second rear edge, a second upper edge, a second lower edge and a plurality of linear fourth guide grooves, the third guide pillar being formed on the second outer side face, each fourth guide groove corresponding to one of the first guide pillars and having a respective third upper end point and a respective third lower end point, the sliding plate being placed on the first inner side face of the first base plate and the main pole body with the second outer side face, such that the third guide pillar is placed in the third guide groove and the second guide groove, and that each first guide pillar is placed in the corresponding fourth guide groove, the first guide groove being located outside the second front edge;

a functional module interface card, comprising N first connectors and having a third outer side face, a third inner side face, a third front edge, a third rear edge, a third upper edge, and a third lower edge, N being an integer larger than 1, the N first connectors being formed at the third lower edge, the functional module interface card being mounted on the second inner side face of the second base plate with the third outer side face, the third rear edge and the second rear edge being adjacent to the first rear edge, the third upper edge and the second upper edge being adjacent to the first upper edge; and a second side cover, comprising a third base plate, a front shield and a rear shield, the third base plate having a fourth outer side face, a fourth inner side face, a fourth front edge, a fourth rear edge, a fourth upper edge, a fourth lower edge and a joint portion, the front shield being formed on the fourth outer side face and extending outward from the fourth front edge, the rear shield being formed on the fourth outer side face and extending outward from the fourth rear edge, the joint portion being located adjacent to the fourth upper edge and being fixed with the first joint member, such that the rear shield covers the third rear edge and the second rear edge, and that the front shield and the first front edge constitute a slit, the head end of the main pole body passing through the slit, wherein when a user operates the operating part to rotate the main pole body to move the second guide pillar to the first upper end point of the first guide groove, the third guide pillar moves toward the front end point of the third guide groove and the second upper end point of the second guide groove, each first guide pillar moves toward the third lower end point of the corresponding fourth guide groove, the sliding plate is actuated to drive the functional module interface card to move toward the first upper edge relative to the first base plate until the N first connectors are at a closest position relative to the first upper edge, when the user operates the operating part to rotate the main pole body to move the second guide pillar to the first lower end point of the first guide groove, the third guide pillar moves toward the rear end point of the third guide groove and the second lower end point of the second guide groove, each first guide pillar moves toward the third upper end point of the corresponding fourth guide groove, the sliding plate is actuated to drive the functional module interface card to move toward the first lower edge relative to the first base plate until the N first connectors are at a farthest position relative to the first upper edge.

2. The swappable device of claim 1, further comprising:

a heat-dissipating component, mounted on the third inner side face of the functional module interface card, the third base plate and the rear shield covering the heat-dissipating component.

3. The swappable device of claim 1, wherein the first side cover further comprises a second joint member, the second joint member is formed on the first inner side face and extends outward from the first rear edge, the rear shield is fixed together with the second joint member.

4. The swappable device of claim 1, wherein the first side cover further comprises a blocking rod formed on the first inner side face and adjacent to the first lower edge, when the second guide pillar moves to the first lower end point of the first guide groove, a lower edge of the main pole body is blocked by the blocking rod.

5. The swappable device of claim 4, wherein the first base plate also has at least one engaging hole, the at least one engaging hole is adjacent to the first upper edge and the first upper end point of the first guide groove, the lever further comprises at least one engaging rod, each engaging rod is formed on the main pole body and corresponds to one of the at least one engaging hole, and each engaging rod is releasably engaged with the corresponding engaging hole.

6. A data processing system, comprising:

a chassis, comprising a front panel, a rear panel, a bottom panel, a first side panel, a second side panel and a top cover, the front panel, the rear panel, the bottom panel, the first side panel and the second side panel constituting an accommodating space, the top cover covering the accommodating space and being capable of sliding relative to the first side panel and the second side panel, the front panel thereon having at least one window;

a motherboard, being mounted on the bottom panel and comprising at least one set of N second connectors, N being an integer larger than 1, each set of N second connectors corresponding to one of at least one window and being arranged in a straight line behind the corresponding window; and at least one first swappable device, each first swappable device comprising:

a first side cover, comprising a first base plate, a first joint member and a plurality of first guide pillars, the first base plate having a first outer side face, a first inner side face, a first front edge, a first rear edge, a first upper edge, a first lower edge, an arc-shaped first guide groove, and a linear second guide groove, the first joint member being formed on the first inner side face and extending outward from the first upper edge, the plurality of first guide pillars being formed on the first inner side face, the first guide groove being adjacent to the first front edge and having a first upper end point and a first lower end point, the first upper end point being adjacent to the first upper edge, the first guide groove extending from the first upper end point toward the first lower edge to the first lower end point, the second guide groove being located between the first guide groove and the first rear edge and having a second upper end point and a second lower end point, the second upper end point being adjacent to the first upper edge, and the second guide groove extending from the second upper end point toward the first lower edge to the second lower end point;

a first lever, comprising a main pole body, an operating part and a second guide pillar, the main pole body having a first tail end, a first head end and a linear third guide groove, the first tail end being pivotally connected to the first inner side face and being adjacent to the first rear edge and the first upper edge of the first base plate, the operating part being formed on the first head end and being located outside the first front edge of the first base plate, the second guide pillar being formed on the main pole body and being capable of being operated in the first guide groove to move between the first upper end point and the first lower end point, the third guide groove being formed between the first head end and the first tail end and having a front end point and a rear end point, the front end point being toward the first head end, the third guide groove extending from the front end point toward the first tail end to the rear end point, and the third guide groove and the second guide groove crossing and overlapping;

a sliding plate, comprising a second base plate and a third guide pillar, the second base plate having a second outer side face, a second inner side face, a second front edge, a second rear edge, a second upper edge, a second lower edge and a plurality of linear fourth guide grooves, the third guide pillar being formed on the second outer side face, each fourth guide groove corresponding to one of the first guide pillars and having a respective third upper end point and a respective third lower end point, the sliding plate being placed on the first inner side face of the first base plate and the main pole body with the second outer side face, such that the third guide pillar is placed in the third guide groove and the second guide groove, and that each first guide pillar is placed in the corresponding fourth guide groove, the first guide groove being located outside the second front edge;

a functional module interface card, comprising N first connectors and having a third outer side face, a third inner side face, a third front edge, a third rear edge, a third upper edge, and a third lower edge, N being an integer larger than 1, the N first connectors being formed at the third lower edge, the functional module interface card being mounted on the second inner side face of the second base plate with the third outer side face, the third rear edge and the second rear edge being adjacent to the first rear edge, the third upper edge and the second upper edge being adjacent to the first upper edge; and a second side cover, comprising a third base plate, a front shield and a rear shield, the third base plate having a fourth outer side face, a fourth inner side face, a fourth front edge, a fourth rear edge, a fourth upper edge, a fourth lower edge and a joint portion, the front shield being formed on the fourth outer side face and extending outward from the fourth front edge, the rear shield being formed on the fourth outer side face and extending outward from the fourth rear edge, the joint portion being located adjacent to the fourth upper edge and being fixed with the first joint member, such that the rear shield covers the third rear edge and the second rear edge, and that the front shield and the first front edge constitute a slit, the first head end of the main pole body passing through the slit, wherein when a user operates the operating part to rotate the main pole body to move the second guide pillar to the first upper end point of the first guide groove, the third guide pillar moves toward the front end point of the third guide groove and the second upper end point of the second guide groove, each first guide pillar moves toward the third lower end point of the corresponding fourth guide groove, the sliding plate is actuated to drive the functional module interface card to move toward the first upper edge relative to the first base plate until the N first connectors are at a closest position relative to the first upper edge, when the user operates the operating part to rotate the main pole body to move the second guide pillar to the first lower end point of the first guide groove, the third guide pillar moves toward the rear end point of the third guide groove and the second lower end point of the second guide groove, each first guide pillar moves toward the third upper end point of the corresponding fourth guide groove, the sliding plate is actuated to drive the functional module interface card to move toward the first lower edge relative to the first base plate until the N first connectors are at a farthest position relative to the first upper edge, wherein when the second guide pillar of one of the at least one first swappable device moves to the first upper end point of the first guide groove, said one first swappable device is inserted into the accommodating space from one of the at least one window such that the front shield of said one first swappable device fits into said one window, when the second guide pillar of said one first swappable device moves to the first lower end point of the first guide groove, the N first connectors of said one first swappable device are at the farthest position relative to the first upper edge to be mated with the set of N second connectors corresponding to said one window.

7. The data processing system of claim 6, wherein the motherboard further comprises a plurality of third connectors, the data processing system further comprises:

a plurality of second swappable devices, each ach second swappable device comprising:

a third side cover, comprising a fourth base plate, a front side plate, an upper side plate and a rear side plate, the fourth base plate having a fifth outer side face, a fifth inner side face, a fifth front edge, a fifth rear edge, a fifth upper edge and a fifth lower edge, the front side plate being formed on the fifth inner side face and extending outward from the fifth front edge, the upper side plate being formed on the fifth inner side face and extending outward from the fifth upper edge, the rear side plate being formed on the fifth inner side face and extending outward from the fifth rear edge, the rear side plate thereon having at least one engaging hole;

a second lever, having a second head end and a second tail end, the second lever being pivotally connected to the upper side plate via the second tail end;

an operating member, mounted on the second head end of the second lever; and a functional component, comprising a casing and at least one engaging rod formed on the casing, each engaging rod corresponding to one of the at least one engaging hole, the casing fits in the third side cover, such that each engaging rod is releasably engaged with the corresponding engaging hole, wherein each second swappable device corresponds to one of the plurality of third connectors, and the functional component of each second swappable device further comprises a fourth connector, the third side cover of each second swappable device further comprises at least one guide rib formed on the rear side plate, each second swappable device is installed in the accommodating space by mating the fourth connector with the corresponding third connector, the front side plate of each second swappable device installed in the accommodation space faces the front panel, between two adjacent second swappable devices, the front side plate of said one second swappable device away from the front panel is fitted between at least one guide rib of said one second swappable device close to the front panel, wherein when the top cover is slid to expose the accommodating space, the operating member of one of the at least one second swappable device is capable of being operated to rotate the second lever upwards so as to disengage the fourth connector from the corresponding third connector and thereby to pull out said one second swappable device.

* * * * *